United States Patent [19]

Miller

[11] Patent Number: 4,626,670

[45] Date of Patent: Dec. 2, 1986

[54] METHOD AND SYSTEM FOR DECODING TIME-VARYING, TWO-FREQUENCY, COHERENT-PHASE DATA

[75] Inventor: Kenneth L. Miller, Torrance, Calif.

[73] Assignee: Xico, Inc., Santa Monica, Calif.

[21] Appl. No.: 504,809

[22] Filed: Jun. 16, 1983

[51] Int. Cl.$^4$ .............................................. G06K 7/00
[52] U.S. Cl. ................................... 235/436; 235/482; 360/2; 369/59; 375/110
[58] Field of Search ...................... 235/436, 449, 482; 360/88, 2; 375/110; 369/59

[56] References Cited

U.S. PATENT DOCUMENTS

| | | | |
|---|---|---|---|
| 3,549,804 | 12/1970 | Greenspan et al. | 375/110 |
| 4,053,736 | 10/1977 | Banka et al. | 360/2 X |
| 4,242,755 | 12/1980 | Gauzan | 375/110 X |
| 4,264,934 | 4/1981 | Mattes | 235/436 X |
| 4,357,707 | 11/1982 | Delury | 375/110 X |

OTHER PUBLICATIONS

"Improved Reader for Magnetically Encoded ID Cards", *Computer Design*, Jan. 1981, pp. 148–149.
"Magnetic-Stripe-Credit-Card Card-Reader", by Austin Lesea and Rodney Zaks, *Microprocessor Interfacing Techniques*, Sybex 2d ed 1977, pp. 120–126.
Data Sheets on "Hand Operated, Miniature Magnetic Card Reader-Model 801 (Rev. Jan. 1980).
Data Sheets on "MT-120 Card Reader" by Magtek.
"Specifications of Omron Manual Type Magnetic Card Reader", by Omron Tateisi Electronics Co.
Data Sheets on "Hand Operated Magnetic Stripe Reader" by Nippondenso.
Data Sheets on "Canon MCR-302".
Data Sheets on "Sanac Model MCM-12 Magnetic Card Reader" by Sankyo Seiki Mfg. Co. Ltd.
Data Sheets on "Magstripe Card Readers" by American Magnetics Corp.

*Primary Examiner*—David L. Trafton
*Attorney, Agent, or Firm*—Kendrick, Netter & Bennett

[57] ABSTRACT

A method and system for decoding time-varying, two-frequency, coherent-phase data, such as data from the stripe on a magnetic stripe-bearing medium, includes detecting flux intervals at the beginning of a bit cell of such data; timing with a clock or counter the length of such a bit cell; digitally determining the average length of at least the two bit cells immediately preceding the cell being measured; and digitally determining whether or not another flux reversal lies at or near the midpoint of the bit cell being decoded.

21 Claims, 9 Drawing Figures

ENVELOPE OF THE WORST CASE FOR RELIABLE READ

```
0800   D8 A2 3F 9A A9 62 85 8F A9 FF 85 85 85 89 85 8A
0810   24 80 10 08 70 03 4C BE 08 4C 24 08 70 03 4C 56
0820   09 4C 88 09 A9 08 85 00 85 89 85 8A A5 82 09 35
0830   29 F5 85 82 A5 8F 29 60 F0 FA A5 82 29 DF 85 82
0840   A9 00 85 88 A5 8F 09 10 85 8F 58 A5 8F 29 60 F0
0850   FA A4 87 A9 00 85 88 85 89 85 8A 98 18 65 01 6A
0860   84 01 AB BE 00 0E C6 00 F0 03 4C 4B 08 A5 82 29
0870   EF 85 82 E4 87 90 FC A5 8F 29 60 D0 0B A5 82 29
0880   F7 09 04 85 82 4C 90 08 A5 82 29 FB 09 08 85 82
0890   85 89 85 8A A5 8F 29 60 F0 FA A4 87 A9 00 85 88
08A0   A5 82 49 03 85 82 85 89 85 8A 98 18 65 01 6A 84
08B0   01 AB BE 00 0E A5 82 49 03 85 82 4C 73 08 A5 82
08C0   09 30 85 82 A9 08 85 00 85 89 85 8A A5 8F 29 60
08D0   F0 FA A5 82 29 DF 85 82 A9 00 85 88 A5 8F 09 10
08E0   85 8F 58 A5 8F 29 60 F0 FA A4 87 A9 00 85 88 85
08F0   89 85 8A 98 18 65 01 6A 84 01 A8 BE 00 0E C6 00
0900   F0 03 4C E3 08 A9 08 85 00 A5 82 29 EF 85 82 E4
0910   87 90 FC A5 8F 29 60 D0 04 18 4C 1E 09 38 66 02
0920   85 89 85 8A A5 8F 29 60 F0 FA A4 87 A9 00 85 88
0930   98 18 65 01 6A 84 01 A8 BE 00 0E 85 89 85 8A C6
0940   00 D0 CC A5 02 85 81 A9 02 85 82 A9 08 85 00 A9
0950   01 85 82 4C 0F 09 20 DB 09 A2 00 A5 82 29 82 C9
0960   80 D0 F8 B5 05 85 81 A5 82 29 FE 09 82 85 82 A0
0970   09 88 D0 FD 09 83 85 82 E8 8A C5 04 F0 03 4C 5B
0980   09 A9 FF 85 81 4C 56 09 20 DB 09 A2 00 A9 08 85
0990   00 B5 05 85 02 A5 82 29 82 C9 80 D0 F8 66 02 B0
09A0   0B A5 82 29 F7 09 86 85 82 4C B4 09 A5 82 29 FB
09B0   09 8A 85 82 A5 82 29 FE 09 82 85 82 A0 09 88 D0
09C0   FD 09 83 85 82 C6 00 D0 CC E8 8A C5 04 F0 03 4C
09D0   8D 09 A5 82 09 8E 85 82 4C 88 09 A5 82 09 F2 85
09E0   82 A5 82 29 40 F0 FA A9 00 85 03 85 04 A9 08 85
09F0   00 85 89 85 8A A5 8F 29 60 F0 FA A5 82 29 DF 09
0A00   82 85 82 A9 00 85 88 A5 8F 09 10 85 8F 58 A5 8F
0A10   29 60 F0 FA A4 87 A9 00 85 88 85 89 85 8A 98 18
0A20   65 01 6A 84 01 A8 BE 00 0E C6 00 F0 03 4C 0E 0A
0A30   A9 08 85 00 A9 FF 85 03 A5 82 29 EF 09 82 85 82
0A40   E4 87 90 FC A5 8F 29 60 D0 04 18 4C 4F 0A 38 66
0A50   02 85 89 85 8A A5 8F 29 60 F0 FA A4 87 A9 00 85
0A60   88 98 18 65 01 6A 84 01 A8 BE 00 0E 85 89 85 8A
0A70   C6 00 D0 CC A9 08 85 00 A5 02 A4 04 99 05 00 E6
0A80   04 C0 36 D0 BB A5 8F 29 60 F0 FA A9 00 85 88 85
0A90   89 85 8A 4C 85 0A A9 08 C5 00 F0 15 A9 FF 85 01
0AA0   06 01 C6 00 D0 FA A5 02 25 01 A4 04 99 05 00 E6
0AB0   04 A5 82 29 BF 09 B2 85 82 60 BA E8 E8 E8 9A 24
0AC0   80 10 08 50 03 4C 24 08 4C BE 08 A5 03 30 03 4C
0AD0   DB 09 4C 96 0A 38 C9
0FFA   BA 0A 00 08 BA 0A
0E00   56 56 57 58 58 59 5A 5A 5B 5C 5C 5D 5E 5E 5F 60
0E10   60 61 62 62 63 64 64 65 66 66 67 68 68 69 6A 6A
0E20   6B 6C 6C 6D 6E 6E 6F 70 70 71 72 72 73 74 74 75
0E30   76 76 77 78 78 79 7A 7A 7B 7C 7C 7D 7E 7E 7F 80
0E40   80 81 82 82 83 84 84 85 86 86 87 88 88 89 8A 8A
0E50   8B 8C 8C 8D 8E 8E 8F 90 90 91 92 92 93 94 94 95
0E60   96 96 97 98 98 99 9A 9A 9B 9C 9C 9D 9E 9E 9F A0
0E70   A0 A1 A2 A2 A3 A4 A4 A5 A6 A6 A7 A8 A8 A9 AA AA
0E80   AB AC AC AD AE AE AF B0 B0 B1 B2 B2 B3 B4 B4 B5
0E90   B6 B6 B7 B8 B8 B9 BA BA BB BC BC BD BE BE BF C0
0EA0   C0 C1 C2 C2 C3 C4 C4 C5 C6 C6 C7 C8 C8 C9 CA CA
0EB0   CB CC CC CD CE CE CF D0 D0 D1 D2 D2 D3 D4 D4 D5
0EC0   D6 D6 D7 D8 D8 D9 DA DA DB DC DC DD DE DE DF E0
0ED0   E0 E1 E2 E2 E3 E4 E4 E5 E6 E6 E7 E8 E8 E9 EA EA
0EE0   EB EC EC ED EE EE EF F0 F0 F1 F2 F2 F3 F4 F4 F5
0EF0   F6 F6 F7 F8 F8 F9 FA FA FB FC FC FD FE FE FF FF
```

FIG. 6   R6500/1 INSTRUCTIONS

LEADING ZERO ROUTINE

DECODE AND OUTPUT ROUTINE

DECODE AND OUTPUT ROUTINE

METHOD AND SYSTEM FOR DECODING TIME-VARYING, TWO-FREQUENCY, COHERENT-PHASE DATA

This invention relates to a method and a system for decoding time-varying, two-frequency, coherent-phase data, referred to as "biphase" or "F/2F" data, such as are generated when hand-swiping magnetic stripe-bearing media such as cards, passbooks and badges through a magnetic-stripe reader containing an ordinary magnetic reader head.

Our new decoding system includes means for determining that validly encoded data are being generated within the limits of our system's capacity to decode such data; means for measuring the time period corresponding to the distance between two flux reversals forming a "bit cell"; means for determining whether or not a data transition (another flux reversal) lies centrally within a concurrently-measured bit cell; and means for outputting or storing a binary signal with the binary value "one" for a bit cell containing a data transition, or with the binary value "zero" for a bit cell containing no data transition before the concurrent bit cell ends.

Magnetic stripe-bearing media have magnetically-encoded, biphase data in the form of a series of flux reversals carried on the stripes on such media. These flux reversals have two kinds of functions. The first kind of function is called a clocking transition; the second, a data transition. The linear distance between two clocking transitions on a stripe is called a bit cell. Where the bit cell contains no intermediate data transition or flux reversal, the bit cell is assigned the binary value of zero in a binary digital system. Where the bit cell includes a flux reversal (i.e., a data transition) that lies between the clocking transitions at the ends of the cell, the cell is assigned the binary value of one in a binary digital system. The data transition in a ones-bit cell is commonly placed at or near the midpoint of a bit cell's length. Accordingly, the distance from the beginning to the end of a bit cell is about twice the distance from the beginning of a ones-bit cell to the data transition in that cell. To decode such magnetically-encoded, biphase data requires first measuring either the linear distance between clocking transitions, or the time required to pass from one cell-edge flux reversal or clocking transition on a stripe to the next cell-edge flux reversal or clocking transition on the same stripe. Secondly, decoding requires determining whether a particular flux reversal on a magnetic stripe is a clocking transition or a data transition. Thirdly, decoding requires determining whether or not a data transition (i.e., a flux reversal) occurs within each bit cell passing over a magnetic reader head. Fourthly, it requires determining when the data has terminated.

Logic requires detecting the clocking transition at the beginning edge of a bit cell. After detecting a clocking edge, one must monitor signals from the magnetic head over which the stripe is passing to determine whether a data transition occurs before the clocking transition at the end of the bit cell reaches the magnetic head. If no flux reversal lies between the leading edge and the cell's end point, then the cell is zero-valued; if a flux reversal or data transition lies between the beginning and end of the bit cell, then the cell is one-valued. The problem is to avoid confusing clocking transitions at the beginning and end of bit cells with data transitions that lie between them. Our method uses the time between flux reversal-induced signals in a magnetic head as a measure of distance between flux reversals.

The procedure first estimates a bit cell's length on a data-bearing medium. The initial or lead-in data are all zeroes and thus all transitions on the initial portion of the magnetic stripe are clocking transitions. After a sufficient number of bit cells have been measured that are consistent in length, a decision can be made that the transitions are data-bearing and not random noise pulses. The cell length of the lead-in zeroes is then the first estimate of cell length. Thereafter, cell length is tracked dynamically by averaging the length of cells most recently encountered.

After an initial cell length has been set, the data content of all successive bit cells is determined by starting a timer and allotting a given time segment following a clocking transition for the occurrence of a data transition, if any is to occur. The time segment is a fixed fraction of the estimated cell length where the size and position of said segment is based on an estimate of probable position of a data transition relative to the next clocking transition. At the end of this time segment, the flux reversal detector flag is sampled, and its status, as to the occurrence or non-occurrence of a data transition within the allotted segment, reported in the form of a data bit. With the timer still running, the clocking function is assigned to the next transition within a given limit of time, which time limit, if exceeded, implies that valid data has terminated. If a transition occurs within the time limit, the cycle is repeated; if not, data sampling is terminated, final data is transmitted, and the reader returns to waiting for another data stream.

At a clocking transition, the timer is read, its value saved, then the timer is reset to the maximum time limit and started again. Concurrent with the passage of the magnetic stripe, the computer means using the just-saved counter value races to compute the time to allot for an occurrence of a data transition. The computer means, being very fast in relation to bit-cell time, can ascertain the time allotment for a large dynamic range of speeds ranging from below one inch per second to above one hundred inches per second, even for high density (210 bits per inch) data tracks. By using an edge detector that records the occurrence of a transition, the computer means is freed from having to make a series of logica decisions about the state of the signal and thus gains higher speeds for decoding biphase data.

Decoding biphase data encoded on the stripes of magnetic stripe-bearing media that are passed over magnetic reader heads by hand presents additional problems. First, the bit cell lengths may vary on a single magnetic stripe as much as 8%. Secondly, the speed and acceleration at which a magnetic stripe passes over the reader head can vary widely depending on the user's hand speed and acceleration. Third, failure of the data translation means to accurately reproduce the encoded data over such a wide-spread range can also result in faulty decoding. The elapsed time between detection of successive flux reversals at magnetic reader heads, whether the flux reversals are clocking or data transitions, is a function of card speed and acceleration, reversal detector errors, the nominal data-encoding density on the stripe, and the deviation from nominal density that any bit cell length may exhibit. The deviations in nominal cell length, called "jitter," must be within certain specified limits where the magnetically-encoded data is intended to conform to ANSI/ISO standards. The other kinds of errors are the equivalent of jitter. A magnetic stripe card reader system must accommodate all time variations resulting from these causes to accurately decode the magnetically-encoded data. Our new reader system has a broad, dynamic operating range, accommodates all of these variations within this range, and accurately decodes magnetically-encoded data.

ANSI standard X4.16-1976/77 and ISO standard 3554 specify the physical and magnetic characteristics of magnetic stripes on plastic, magnetic stripe-bearing cards, as well as the encoding techniques, bit densities, character sets and formats. These standards require three tracks of magnetic data per stripe on such magnetic stripe-bearing cards. These tracks are numbered, in order, from the edge of the magnetic stripe-bearing card as follows:

| Track No. | Title | Bit Density bits/inch (BPI) | Character Set |
|---|---|---|---|
| 1 | IATA | 210 BPI | 64 Alphanumeric |
| 2 | ABA | 75 BPI | 16 Numeric |
| 3 | THRIFT | 210 BPI | 16 Numeric |

Tracks 1 and 3 are commonly called "high density"; track 2, "low density." Our new system accommodates and reads accurately not only tracks with these bit densities, but can be configured to read any encoding density in the range of about 25 to about 300 bits per inch on any track, independent of the character sets and formats for the character sets on the track.

The two-frequency, coherent-phase signals detected at a magnetic reader head as magnetically-encoded data are accurately decoded by our new decoding system. These signals may pass through a reversal detector circuit and then pass to our decoding system. Our system includes timer means, comprising a clock means and a counter, edge-detector means, computer means, and means for permanently storing a program for the system. When the signal from the magnetic head indicates a clocking transition at a bit cell boundary, our system detects the transition by the edge detector means and stores the digital value of the counter. Our system then resets the counter to its maximum value which begins timing the time span of the next bit cell passing over the magnetic head reader head. While the counter means is timing the length of the concurrent bit cell, the computer means estimates the probable length of the concurrent bit cell by averaging the lengths of two or more bit cells immediately preceding the concurrent bit cell. The computer means also determines a value for a test point posterior to where a data transition should be in the concurrent bit cell, if a data transition is present at all. Our preferred embodiment comprises storage means that includes a value for the test point for every possible value of the counter. When the counter reaches the test value, our computer means samples the edge-detector means to determine whether or not a data transition has appeared at the input of the edge-detector means. If a data transition has appeared, then the cell is assigned the digit one; if not, the bit cell is assigned a zero digit.

When the counter for the timer means is reset, it is set for the maximum count allowed for the next clocking transition. The counter is decremented and, if it reaches zero before the occurrence of a clocking transition, we initiate an end of valid data actions and cycle back to waiting for a new data string.

FIG. 6 is a program for the R6500/1 Rockwell microcomputer that we can use in our system;

FIGS. 1 and 2 are flow charts illustrating how our decoding system operates.

Figure 1:
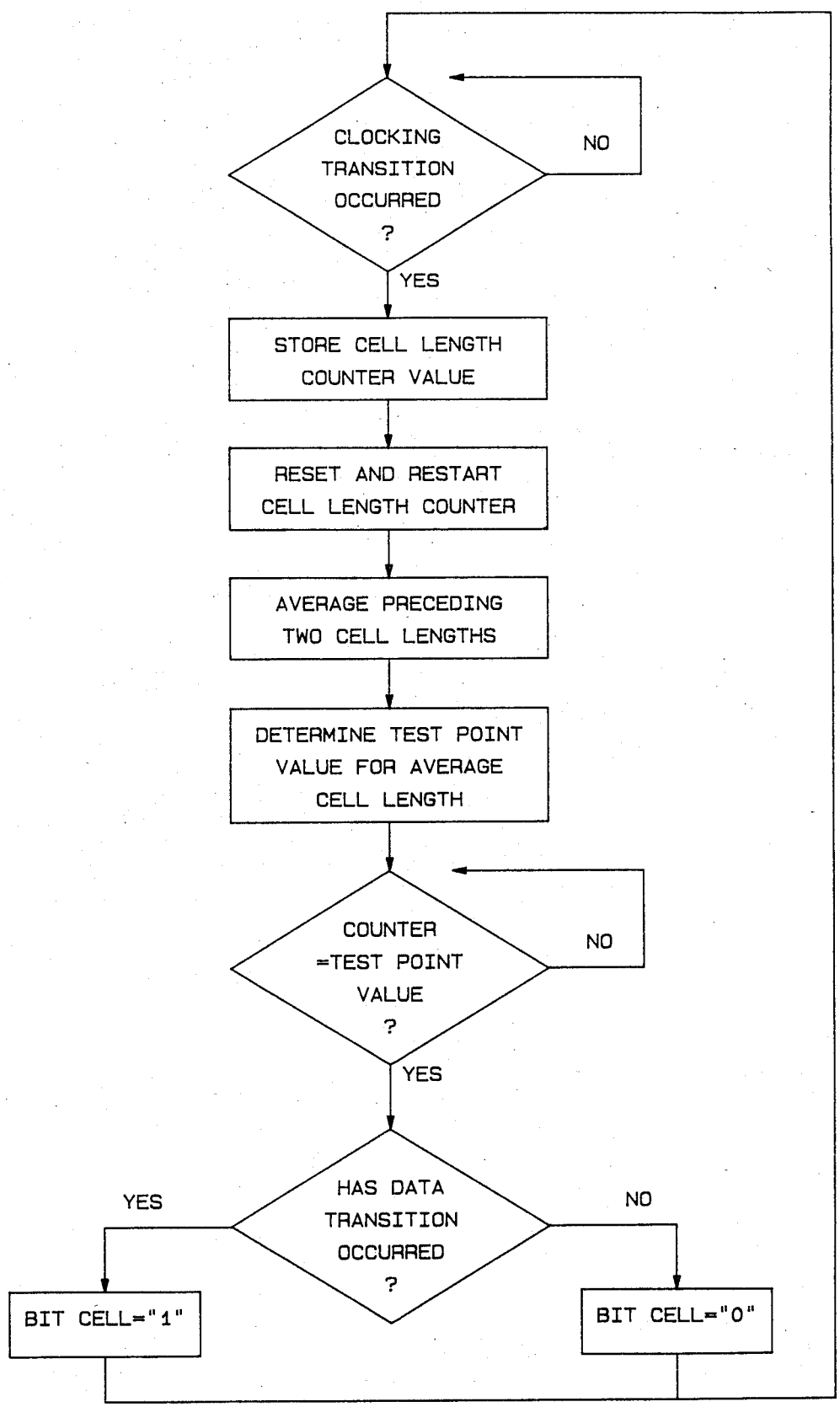
FIG. 1 is a flow chart illustrating how our decoding system operates.

Referring first to FIG. 1, our decoded system inquires whether or not a clocking transition or cell edge has appeared at the magnetic reader head. Once such an edge appears, the count accumulated in the timer between that cell edge and the preceding cell edge (cell length) is stored in the storage means, and the counter is reset and started anew to measure the time interval or length of the now current bit cell. Once the timer means has begun measuring this length, the computer means in our system calculates a probable time interval of the concurrent bit cell by averaging the length of the next preceding bit cell length, and then determines or computes a value for a point posterior to where a data transition, if any, should be in the concurrent bit cell. When the counter reaches the test value for the concurrent bit cell, the decoder means determines whether or not a transition has occurred before that point in time. If the transition has occurred, then the concurrent bit cell is assigned a binary one. If not, the concurrent bit cell is assigned a binary zero.

Figure 2:
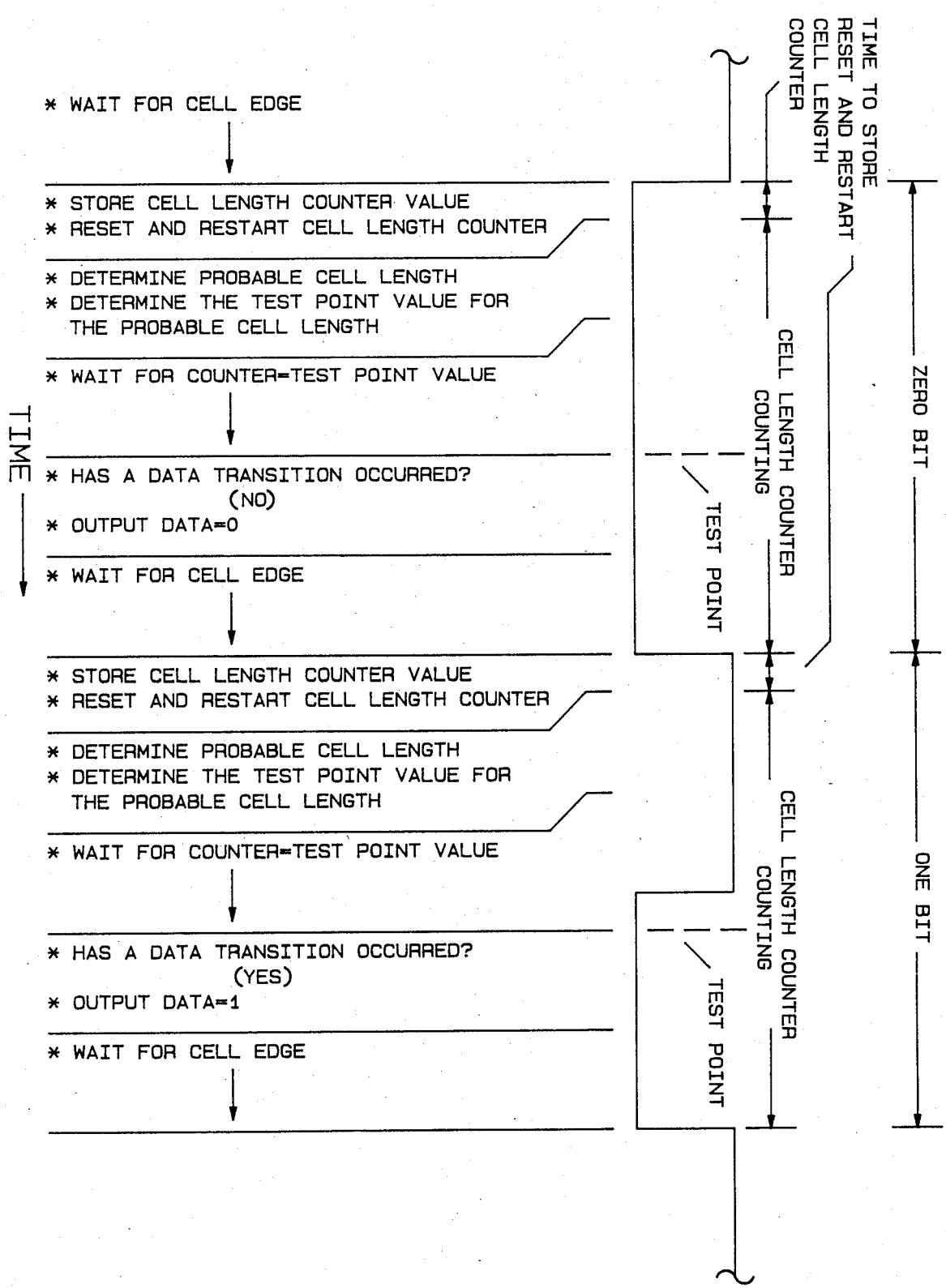
FIG. 2 shows the time sequence of events that occur in our system in response to zero-bit and one-bit signals coming from a magnetic head.

FIG. 2 shows the sequence of these events, first for a zero bit and then for a ones bit. At the outset, the system is looking for a cell boundary or clocking transition. Our decoding system saves and stores the value of the counter for the just-ending cell length, and resets the counter to its maximum value to begin measuring the time interval of the now current bit cell. Some time is needed to read and reset the counter, but for most stripe speeds that pass a magnetic head by hand, this time is much shorter than the bit cell interval. Moreover, the time difference is accounted for in the test value.

After restarting the counter means, our system quickly computes the average of the next preceding two or more bit cells to estimate the probable length of the concurrent bit cell, and then computes or simply obtains from the storage means the value which the counter means will have when the time equals an optimum test time for the concurrent bit cell. Our system uses two-thirds of a cell length to allow for a 33% increase or decrease from the average. This system then waits for the counter to reach the time at which two-thirds of the instantaneous bit cell has passed, and determines whether a data transition occurred prior to this point. If so, the concurrent bit cell is assigned the binary value one; if not, then the instantaneous bit cell is assigned the binary value zero. Because a bit cell is assigned its binary value before the bit cell has ended, our system can utilize the binary value assigned to the instantaneous bit cell before the next cell starts.

In our preferred embodiment, the timer means comprises a decoding clock having a cycle that equals 1/255th of the maximum bit cell interval that our system can decode. Using a 3.579 megahertz crystal to clock the computer means, our new system can decode biphase having a density of 210 bits per inch where the speed at which the data passes over a magnetic reader head is in the range of about two inches per second to about 60 inches per second with little effect from the rate of acceleration between these two speeds encountered in a hand-operated system.

In the preferred embodiment of our new system, our microcomputer means uses an edge-sensitive detector means which sets a flag internal to the computer means. This embodiment checks the flag at the test point to see if a data transition has occurred. In our preferred embodiment, the counter means decrements and generates an interrupt if it reaches zero, which shortens our system's response time because our computer means need not check the counter for zero. However, our system need not include edge-sensitive inputs or interrupting counters providing the system includes a timer means to measure bit cell lengths.

Figure 3:
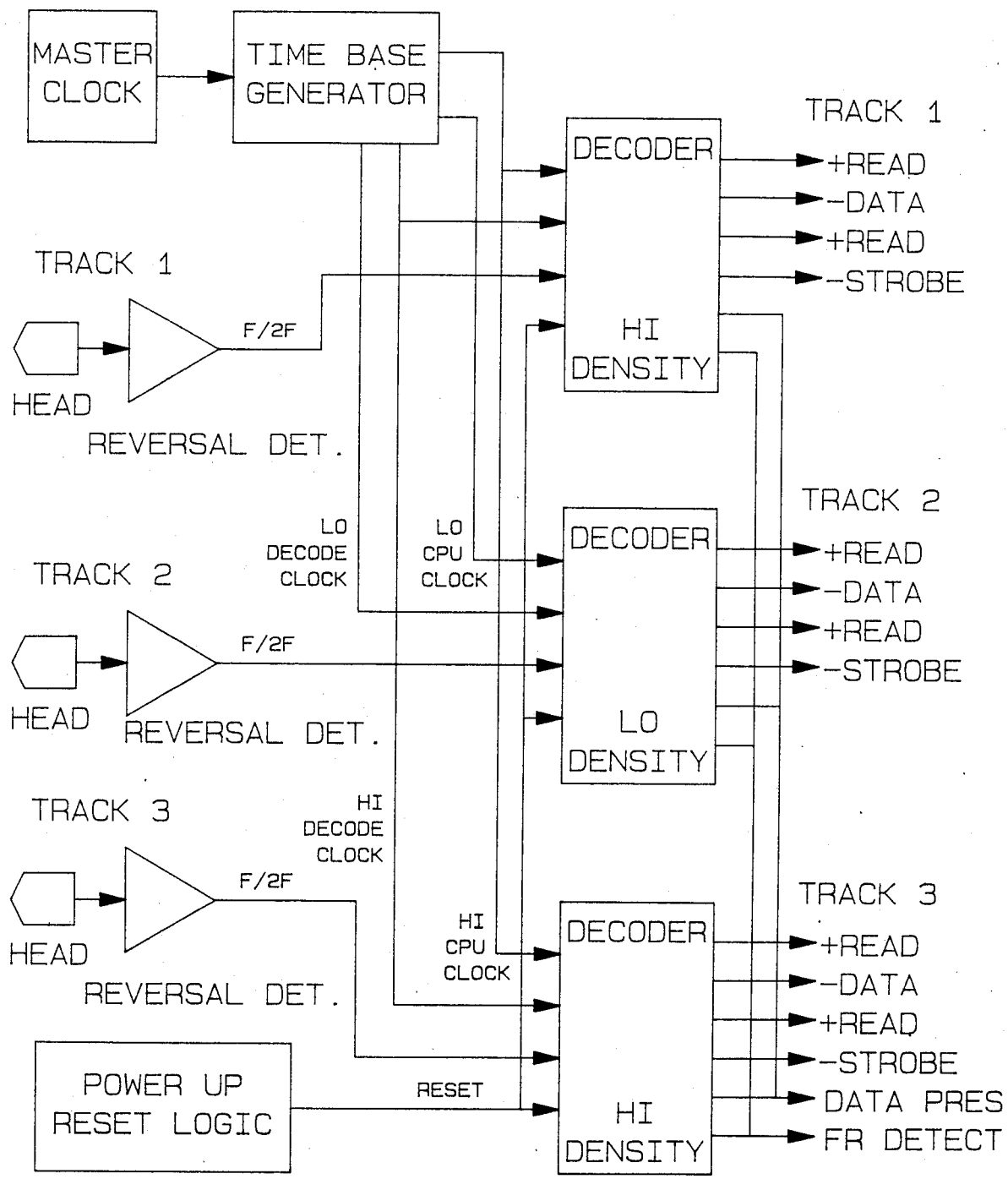
FIG. 3 is a block diagram for our three-track magnetic-stripe decoder system.

FIG. 3 is a block diagram for the preferred embodiment of our magnetic stripe card reader system. FIG. 3 shows that the flux reversals, whether clocking transitions or data transitions, on three tracks of the stripe on a magnetic stripe-bearing card, are detected by three separate magnetic reader heads. The biphase signals from each head pass through separate reversal detector circuits for each head. These signals are then presented to the edge-detector input of our new decoders. Our decoders also receive two separate frequencies from a time-base circuit which includes a crystal-oscillator master clock and a frequency divider. The time-base circuit produces a high frequency clock rate that runs the internal logic of the computer means, and a lower frequency clock rate that is used to measure the length of a cell in time. The clocking frequencies supplied to the computer means and the timer means are reduced if the data density on the magnetic stripe is reduced. Our decoders convert the biphase signal into a stream of binary bit data with data-clocking strobes.

Both the read data and read strobe signals from our decoders are differential outputs. Either or both may be positive or negative, single ended. The system user may select the signal sense appropriate to his end use.

The duration of the read strobe output from our system is independent of the speed at which the data passes over the magnetic reader head. Moreover, the system receiving this output may employ either an edge sense or a level sense for its application.

Our new decoding system also produces a signal that denotes detection of flux reversals at the magnetic reader head. This flux reversal detect output goes low and stays low as long as flux reversals continue to pass over the magnetic reader head at a rate above the lower limit of the dynamic operating range of our new decoding system.

Our new system also outputs a signal denoting the presence (or detection) of valid biphase data. This so-called "data present" output goes low when, but only when, a preset number of leading zero-valued cells required for initial timing occur at a rate within the dynamic range of our system. The data-present function signals the user that biphase data are occurring at a rate above the lower limit of the dynamic range of our new system and data are currently being decoded. This eliminates the need for a separate media detect switch. The data-present function prevents invalid read data and read strobe outputs that might result from electrical or magnetic noise at the magnetic reader head.

Our system also contains power-up logic that inhibits decoding until the circuits and master clock have stabilized.

Figure 4:
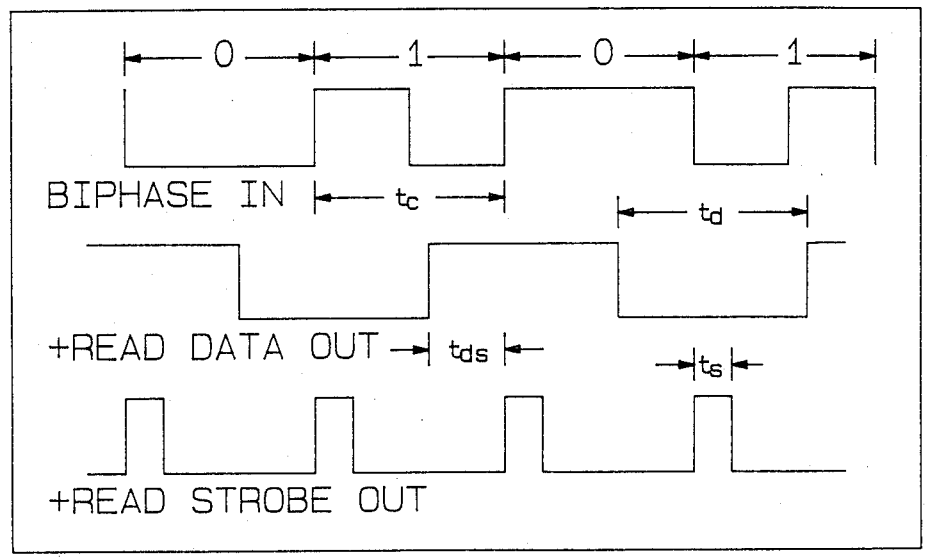
FIG. 4 shows a timing sequence for data output from the new system.

FIG. 4 presents a timing diagram showing the relationships among the biphase signal, the read data signal, and the read strobe signal. As the timing diagram shows, our read data signals are valid continuously from a time before until a time after the read strobe signal begins and ends.

Figure 5:
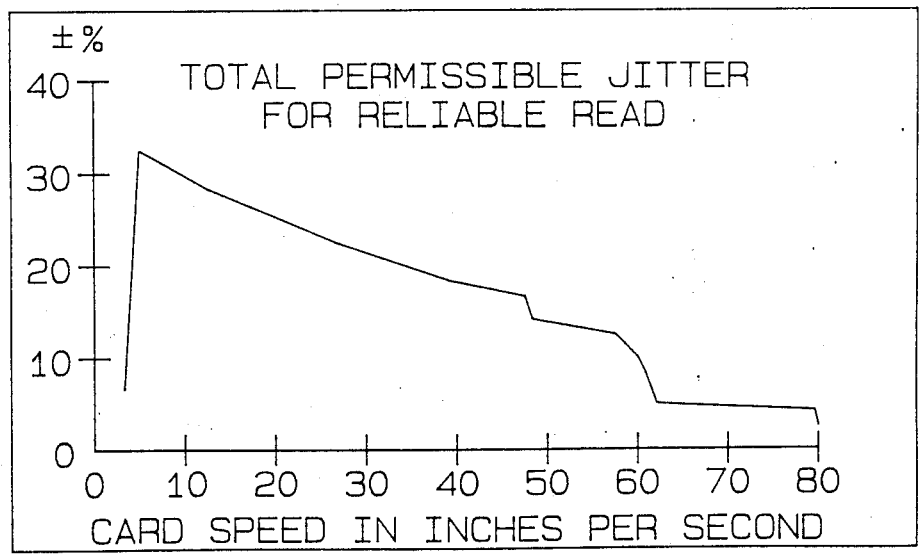
FIG. 5 is a graph of jitter tolerance against card speed.

FIG. 5 illustrates the effects of both encoded card jitter and equivalent jitter resulting from varying card acceleration and speed during passage of a magnetic stripe over a reader head. By contrast, ANSI/ISO specifications for maximum encoded jitter is about 5% for track No. 1; about 3% for track No. 2; and about 8% for track No. 3.

Our new decoder system delivers precision performance on a broad, dynamic operating range. Because our decoding system is fully digital, precise operating characteristics for card speeds and total jitter are dictated solely by the choice of the master clock for any specified bit-encoding density. For a given encoding density and a given master clock, our new decoder system can accommodate card speed in the range of about 25 to 1, and can accommodate total jitter in the range of about 30% at the low end of such range to greater than 10% at the high end of the range.

Our decoder system is sensitive only to the data rate, i.e., the product of density of data encoded on the magnetic stripe times the speed at which the stripe passes over the magnetic reader head, and not to these two factors individually. Accordingly, wide variations in encoding density on a magnetic stripe affect only the upper and lower limits on card speed for a given timer means in our decoder system. FIG. 5 shows that our new decoder system tolerates wide variations in the practical operation of reader systems, whether those variations result from encoded jitter or the acceleration and speed at which an individual passes a magnetic stripe over the reader head.

Appended to this application as FIG. 6 is the complete program for operating our new decoder system. By this reference, we incorporate this program in this specification as though fully set forth here.

Figure 7A:
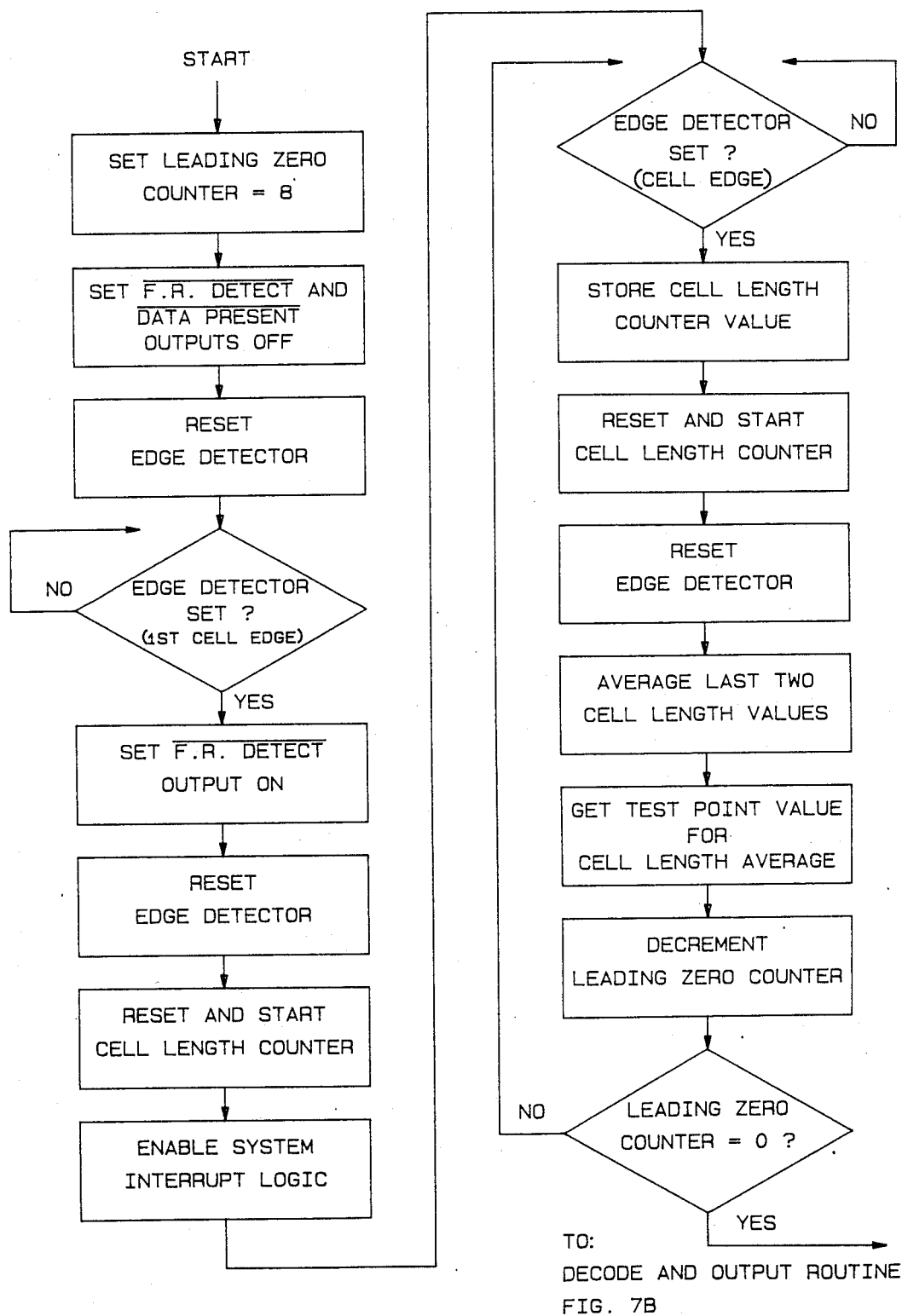
FIG. 7A is a flow chart for determining the beginning of valid data.
Figure 7B:
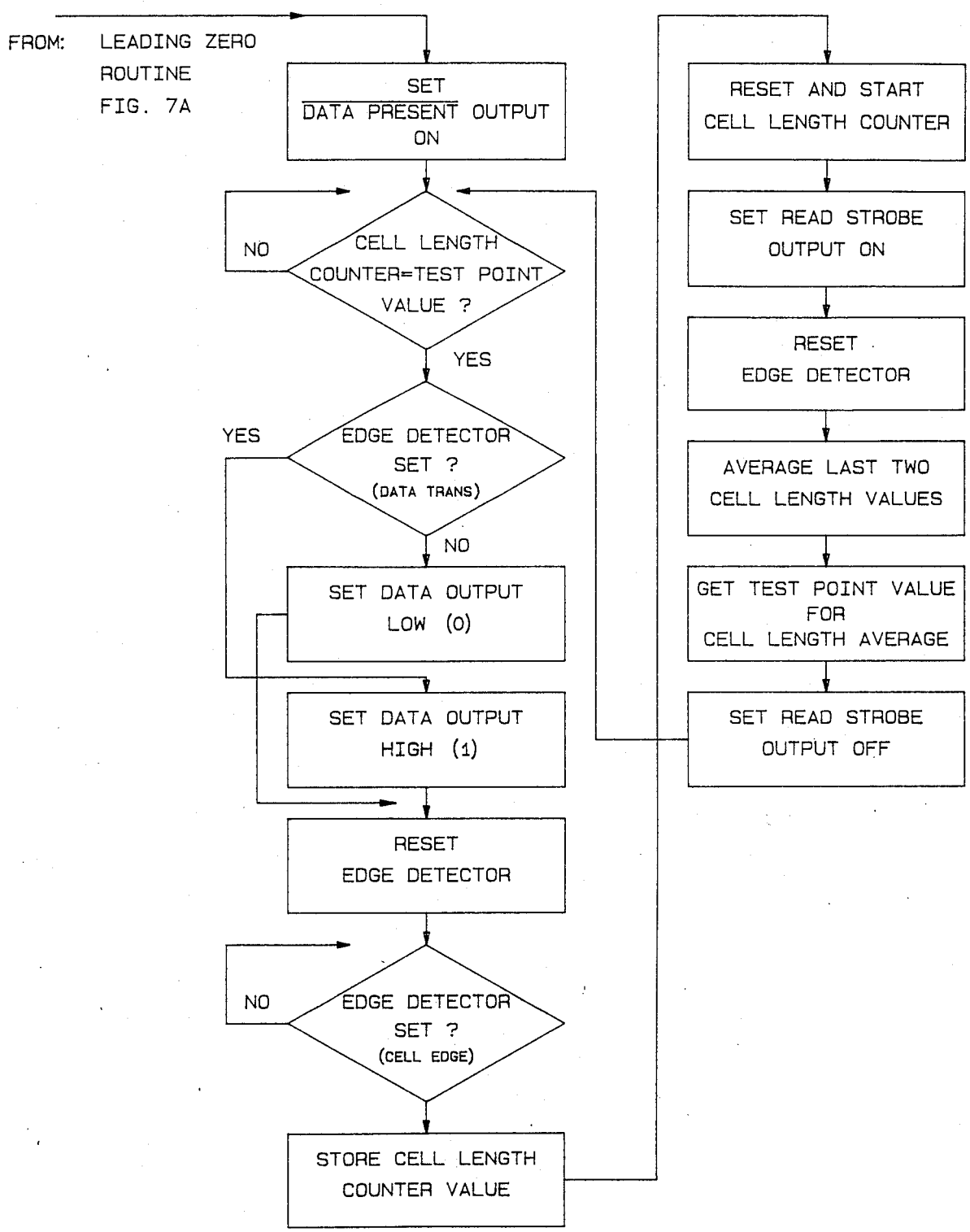
FIG. 7B is a flow chart for serial data output.

FIGS. 7A and 7B comprise a flow chart showing how our new decoding system serially outputs the date from magnetically-encoded, magnetic stripe-carrying media. First, our system looks for a fixed number (here, 8) of successive zero-valued bit cells (i.e., eight successive bit cells that have no data transition within them). After our system detects eight successive zero-valued cells, by decrementing and resetting a "leading zero" counter eight times, our system then serially outputs the succeeding zero-valued and one-valued bit cells as valid data. For each such valid data bit cell, our system produces a read data signal and a data strobe signal, as explained above. If and when the bit cell length counter decrements to zero without the detection of a clocking transition, our system interrupts the serial output of read data and read strobe signals and awaits a new "leading zero" count before resuming serial output of such signals.

Figure 8:
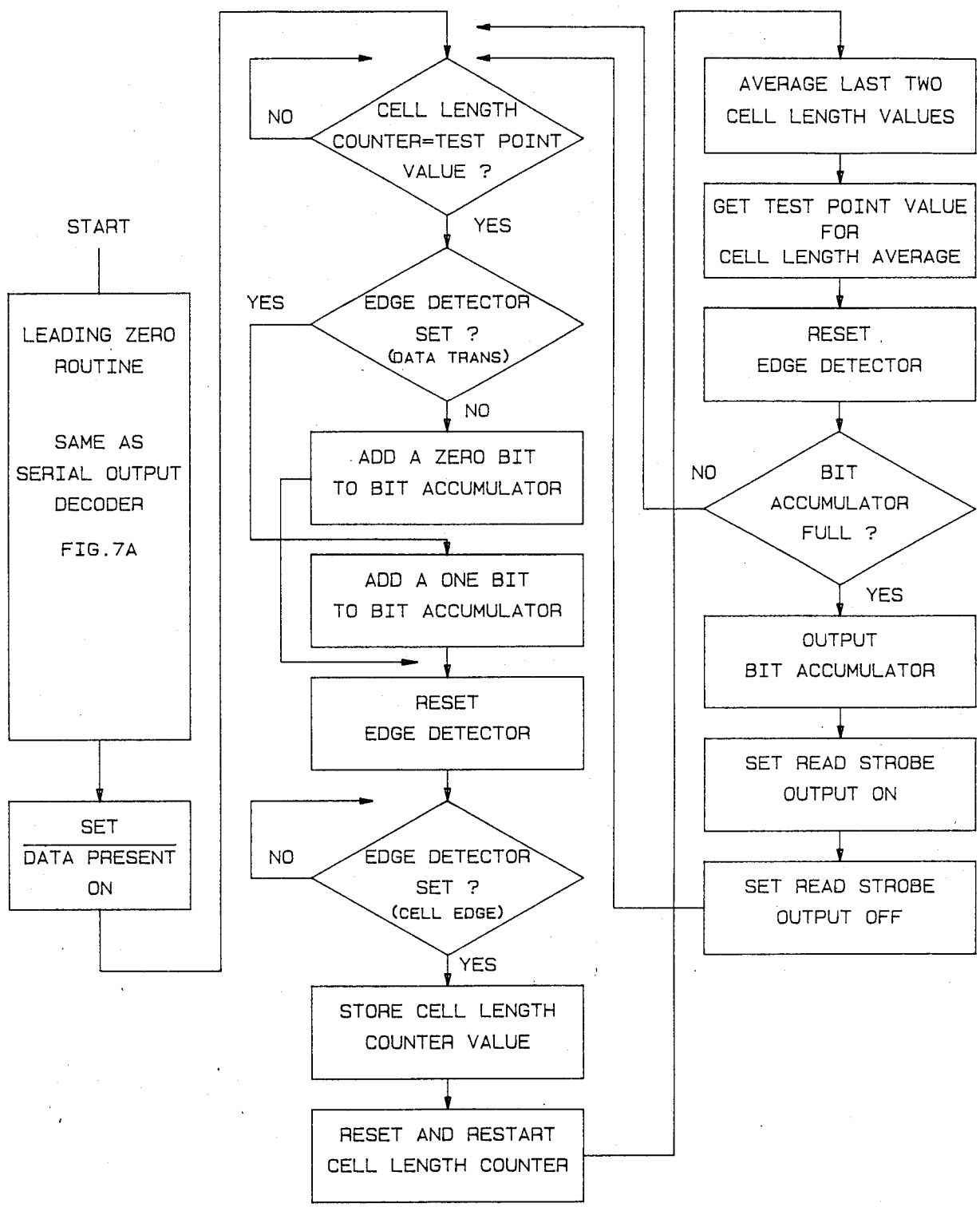
FIG. 8 is a flow chart for eight-bit parallel data output from a magnetically-encoded magnetic stripe.

FIG. 8 shows parallel output of the data from a magnetically-encoded magnetic stripe. Again, our system looks for a fixed number of leading zeroes before outputting encoded data as read data and read strobe signals. Thereafter, our system stores a fixed number (here, 8) of data bits in memory before outputting the stored group of bits as a single byte.

What is claimed is:

1. A system for decoding two-frequency, coherent-phase data encoded as a plurality of bit cells with each bit cell comprising the time between two consecutive clocking transitions and one or no datum transition between said two clocking transitions, said system comprising: means for detecting transitions; means for measuring the time periods corresponding to the lengths of said bit cells; means for determining the optimum time to test whether a datum transition, if any exists, has occurred within the currently-measured bit cell; and means for determining the probable time length of said currently-measured bit cell and means for determining the optimum testing time for the prior occurence of a datum transition in said currently-measured bit cell from the average time length of at least the next two preceding bit cells; means for detecting the occurrence of a datum transition, if any exists, within said currently-measured bit cell.

2. The system of claim 1 further comprising means for declaring data valid after a predetermined number of bit cells of predetermined value pass said detecting means.

3. The system of claim 1 further comprising means for storing test point values for every measured time for a bit cell.

4. The system of claim 3 wherein every test value in said storing means includes an adjustment to account for the time required to reset the means for measuring the time periods corresponding to the lengths of said bit cells.

5. The system of claim 1 further comprising means for registering the occurrence or non-occurrence of a datum transition within a current cell, and means for sampling said registering means before said current bit cells ends.

6. The system of claim 1 further comprising means for producing binary signals accurately representing all the validly-encoded bit cells on a data-bearing magnetic stripe, where the density of bit cells on said magnetic stripe is in the range of about 25 to about 300 bits per inch, and where the speed at which said magnetic stripe moves past said detecting means is in the range of about 2 to about 80 inches per second.

7. The system of claim 5 wherein said system is hand-operated, and can accommodate rates of acceleration or deceleration from up to 10% at the highest speed to up to 30% at the lowest speed.

8. The system of claim 6 wherein, for a density of bit cells on said magnetic stripe in the range of about 25 to 300 and for a given means for measuring the time period corresponding to bit cell length, said decoding is accurate and complete where said medium passes said detecting means at speeds in the range of about 25 to 1, and where the total jitter is not more than about 30% at the lowest speed, and is not more than about 10% at the highest speed.

9. The system of claim 1 further comprising means for storing or outputting binary signals from said system at a time and for a period indepentent of the data input rate.

10. The system of claim 1 further comprising means for generating a signal that denotes whether or not validly encoded data is input at a rate above the lower limit of the dynamic operating range of said system.

11. A system for decoding magnetically encoded, two-frequency, coherent-phase data encoded as a plurality of bit cells on a magnetic stripe-bearing medium with each bit cell comprising the space between two consecutive clocking transition flux reversals at its boundaries and one or no datum transistion flux reversal between said two clocking transitions, said system comprising: means for measuring the time periods corresponding to the lengths of said bit cells, and means for determining, for each of said bit cells, the optimum time to test whether a datum transition, if any exists, has occurred within the currently-measured bit cell from the average time length of at least the two bit cells immediately preceding said currently-measured bit cell; means for registering occurrence or non-occurrence of a datum transition within said currently-measured bit cell; and means for sampling said registering means to determine whether or not a datum transition has occurred prior to said optimum testing time.

12. The system of claim 11 further comprising digital means for averaging cell lengths.

13. The system of claim 1 further comprising the means for adjusting the decodable data rate.

14. The system of claim 1 further comprising means for storing testing times corresponding to the rate at which data is presented to said system.

15. The system of claim 14 further comprising means for presenting the results of testing said currently-measured bit cell, and means to indicate that the result of said testing is available.

16. The system of claim 1 further comprising means for presenting the results of testing said currently-measured bit cell, and means to indicate that the result of said testing is available.

17. The system of claim 11 further comprising means for presenting the results of testing said currently-measured bit cell, and means to indicate that the result of said testing is available.

18. The system of claim 11 further comprising means for determining if sufficient zero bits have occurred to declare data valid, means to signal valid data present, and means for determining if said bit cell period is below a threshold value.

19. The system of claim 11 further comprising means for storing test point values for every measured time for a bit cell.

20. The system of claim 19 wherein every test value in said storing means includes an adjustment to account for the time required to reset the means for measuring the time periods corresponding to the lengths of said bit cells.

21. The system of claim 19 further comprising means for presenting the results of testing said currently-measured bit cell, and means to indicate that the result of said testing is available.

* * * * *